United States Patent [19]

Matuzaki et al.

[11] Patent Number: 4,734,299

[45] Date of Patent: Mar. 29, 1988

[54] SENSITIZING AGENT FOR ELECTROLESS PLATING AND METHOD FOR SENSITIZING SUBSTRATE WITH THE AGENT

[75] Inventors: Isao Matuzaki, Nagano; Kenzi Tonoki, Yuki; Takehiko Ishibashi, Oyama; Haruki Yokono, Yuki, all of Japan

[73] Assignee: Hitachi Chemical Co. Ltd., Japan

[21] Appl. No.: 750,779

[22] Filed: Jul. 1, 1985

[30] Foreign Application Priority Data

Jun. 29, 1984 [JP] Japan ................. 59-136041
Jun. 29, 1984 [JP] Japan ................. 59-136042

[51] Int. Cl.$^4$ ............................................. C23C 3/02
[52] U.S. Cl. ................... 427/304; 106/1.11; 427/305
[58] Field of Search ................. 106/1.11; 427/304, 306

[56] References Cited

U.S. PATENT DOCUMENTS

| | | | |
|---|---|---|---|
| 3,414,427 | 12/1968 | Levy | 427/306 |
| 3,963,841 | 6/1976 | Anschol | 427/305 |

FOREIGN PATENT DOCUMENTS

| | | | |
|---|---|---|---|
| 4,329,242 | 12/1968 | Japan | 427/306 |
| 49-53537 | 5/1974 | Japan | 427/305 |
| 600210 | 3/1978 | U.S.S.R. | 427/306 |

*Primary Examiner*—Sam Silverberg
*Attorney, Agent, or Firm*—Antonelli, Terry & Wands

[57] ABSTRACT

A sensitizing agent for electroless plating which comprises a solution of at least one of palladium (II), silver (I), copper (I), copper (II), and nickel (II) compounds in an amide and a method for sensitizing substrates made of plastics or ceramics which comprises treating the substrates with the sensitizing agent, followed by treating them with a reducing solution, are provided.

6 Claims, No Drawings

SENSITIZING AGENT FOR ELECTROLESS PLATING AND METHOD FOR SENSITIZING SUBSTRATE WITH THE AGENT

BACKGROUND OF THE INVENTION

1. Field of the Invention

The present invention relates to a sensitizing agent for electroless plating and to a method for sensitizing substrates with the agent.

2. Description of Related Art

Electroless plating, including electroless copper plating, is widely applied in the field of printed circuit boards to form circuits on electrically insulative substrates such as plastic laminated boards and the like. In this case, the substrate to be electroless-plated is subjected to sensitization, i.e. treatment to form catalytic nuclei for electroless plating thereon, before immersing in an electroless plating bath. For instance, copper ions in the bath are deposited as metallic copper around these catalytic nuclei and grow into copper films, thus forming circuits. To sensitize electrically insulative substrates, fine particles of metallic palladium, silver, copper, or nickel which act as catalytic nuclei for electroless plating are formed on the surfaces of the substrates. As an example, palladium particles for this purpose, according to the prior art, are produced by such reaction as follows:

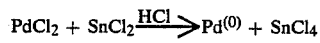

$$PdCl_2 + SnCl_2 \xrightarrow{HCl} Pd^{(0)} + SnCl_4$$

$PdCl_2$—$SnCl_2$—HCl sensitizing systems are described in U.S. Pat. Nos. 3,011,920, 3,960,573, and 3,969,554.

The $PdCl_2$—$SnCl_2$—HCl sensitizing system containing much impurities including Sn and Cl is strongly acidic and, therefore, apparatuses exposed thereto are damaged and the pink-ring phenomenon of inner layer circuits in multilayer circuit boards occurs.

The pink-ring phenomenon of inner layer circuits is described as follows:

Multilayer printed circuit boards are produced in the manner that circuits are formed by etching copper-clad laminated sheets, the resulting inner layer circuit sheets and prepregs (products of impregnating base materials such as paper and glass fabrics with thermosetting resins, followed by drying them) are superposed alternately one over another; the top layer is overlayed with a copper foil or a laminate clad with copper on one side; the whole laminate is heated and pressed into a single body; the copper on the top layer is processed to form a circuit correspondingly to the pattern of the inner layer circuit; through-holes are formed by perforating layers at required positions (including a part of the inner layer circuits); and a metal layer is formed on the inner wall of each through-hole by electroless plating. In this process, the surfaces of the inner layer circuits are coated with copper oxide (usually 1-3 μm thick) so as to enhance the adhesion between each inner layer circuit and the prepreg facing it. The inner wall of each through-hole is sensitized before the electroless plating. When the $PdCl_2$—$SnCl_2$—HCl sensitizing system is used for the sensitization, portions of the oxide coat exposed to the through-holes will dissolve in hydrochloric acid, and hydrochloric acid will diffuse into the interface between the surface of the inner layer circuit and the prepreg resin layer, thus causing delamination. This is the pink-ring phenomenon. When this phenomenon occurs the bond strength and the insulation resistance of the laminate will become lower.

SUMMARY OF THE INVENTION

An object of the present invention is to provide a sensitizing agent for electroless plating which damages exposed apparatuses to a minimum extent and causes no pink-ring phenomenon.

Another object of the invention is to provide a method for sensitizing such substrates with the agent.

According to the invention, there is provided a sensitizing agent for electroless plating which comprises a solution of at least one of palladium (II), silver (I), copper (I), copper(II), and nickel (II) compounds dissolved in an amide.

DETAILED DESCRIPTION OF PREFERRED EMBODIMENTS OF THE INVENTION

Suitable amides for use in the present invention include formamide, dimethylformamide, diethylformamide, dimethylacetamide, dimethylarylamide, and mixtures of these amides.

Suitable compounds of pallatidum (II), silver (I), copper (I), copper (II), and nickel (II) for use in the invention include chlorides, fluorides, bromides, iodides, nitrates, sulfates, oxides, sulfides, and mixtures of these compounds. Of these compounds, particularly preferred are the chlorides.

These compounds are dissolved each in the above-mentioned amide, and the solution is diluted with water or alcohol to make up a sensitizing agent having a compound concentration of 0.01 to 1.0% by weight and a pH of 3 to 14, preferably 11 to 13, most preferably 11.5 to 12.5. It is considered that the above compound, dissolved in the above amide, may form a complex with the amide.

When substrates, such as plastic laminated boards, ceramic boards, plastic molded articles and plastic films, which are intended to be plated are dipped in the sensitizing agent and then soaked in a reducing solution, metallic nuclei of palladium, silver, copper, and/or nickel are formed on the substrate surfaces.

Suitable reducing solutions for use herein are aqueous or alcoholic solutions of reducing substances such as formaldehyde, stannous chloride, sodium borohydride ($NaBH_4$), grape sugar, and the like. The concentration thereof is desirably from 0.01 to 10%, preferably from 0.1 to 1% by weight, and the pH is desirably from 3 to 14.

The above reducing substances may be used alone or combination with one another or with a stabilizer having buffer action, for example, methanol for formaldehyde, hydrochloric acid for stannous chloride, or sodium hydroxide for sodium borohydride.

Electroless plating is effected on immersing the substrate on which nuclei of palladium and/or the like have been thus formed for plating, in an electroless plating bath, which may be a commonly used electroless plating solution of copper, nickel, or the like.

The sensitizing effect can be further improved by a pretreatment of the substrate to be plated before it is immersed in the sensitizing agent defined above, for electroless plating, of the present invention.

For this pretreatment, it is possible to use an 0.1 to 10% aqueous hydrogen peroxide, an aqueous hydrogen peroxide having the same concentration and adjusted with sulfuric acid to pH 3–6, hydrochloric acid of pH 3–6, sulfuric acid of pH 3–6, a 0.1 to 10% solution of an epoxy resin of bisphenol A type in water, alcohol, or methyl ethyl ketone, and the above-mentioned reducing solution.

In stead of the immersion in the sensitizing agent for electroless plating and the reducing solution, the substrate may be sprayed with these solutions.

EXAMPLE 1

A both-side copper-clad galss-epoxy laminated board (1.6 mm thick) which was dipped previously in an aqueous solution of a mixture of sodium hydroxide, potassium chlorite, and sodium phosphate to form an oxide coat on each copper surface was drilled to form through-holes and then immersed for 5 minutes in a sensitizing solution prepared by diluting a 2.0% by weight concentration solution of $PdCl_2$ in formamide, with water to a $PdCl_2$ concentration of 0.1% and pH 12.5. After removing the liquid, the board was immersed with joggling itself in a 1% solution of sodium borohydride in 1% aqueous NaOH for 5 minutes, then immersed in an electroless plating solution CUST-201 (tradename, made by Hitachi Chemical Co., Ltd.) for 20 minutes, and rinsed with water. As a result of the electroless copper plating, copper was uniformly deposited on the inner walls of the through-holes in the glass-epoxy laminated board and no chemical attack of the oxide coats covering the copper surfaces was observed.

EXAMPLE 2

The same both-side copper-clad glass-epoxy laminated board (1.6 mm thick) as used in Example 1 was coated with the oxide as in Example 1, drilled to form through-holes, and rinsed.

The board was then treated with a 1.0% solution of $NaBH_4$ in 0.1% aqueous NaOH for 30 seconds.

A sensitizing agent was prepared by diluting a 1% solution of $PdCl_2$ in formamide with an 0.3% aqueous NaOH solution to a $PdCl_2$ concentration of 0.05% and pH 12. The board was immersed in this sensitizing agent and joggled well for 5 minutes. After removing the liquid, the board was treated with a 1.0% reducing solution of $NaBH_4$ in 0.1% aqueous NaOH for 3 minutes, then immersed in an electroless copper plating solution, CUST-201 (the same as used in Example 1) for 20 minutes, and rinsed with water. As a result of this electroless copper plating, copper was uniformly deposited on the walls of the through-holes in the board and no chemical attach of the oxides films covering the copper surfaces was observed.

According to the present invention, the following effects can be achieved.

(1) The damage of the apparatus exposed to the sensitizing agent for electroless plating is reduced since the pH of the solution is in the range of 3 to 14.

(2) Uniform plating can be accomplished.

(3) No chemical attack of the inner layer circuits of multilayer printed circuit boards occurs.

What is claimed is:

1. A sensitizing agent which does not chemically attack copper oxide for electroless plating which consists of water or alcohol and a solution of at least one metal compound of a metal selected from the group consisting of palladium (II), silver (I), copper (I), copper (III), and nickel (II) dissolved in an amide; said agent having a pH in the range of 11 to 13 and the concentration of the metal compound in the agent being from 0.01 to 1.0% by weight.

2. The sensitizing agent of claim 1, wherein the amide is at least one member selected from the group consisting of formamide, dimethylformamide, diethylformamide, dimethylacetamide and dimethylacrylamide.

3. The sensitizing agent of claim 2, wherein said metal compound is at least one member selected from the group consisting of a chloride, fluoride, a bromide, an iodide, a nitride, a sulfate, an oxide and a sulfide of said metal.

4. A method for sensitizing a substrate to be electroless-plated which comprises treating the substrate with a sensitizing agent which does not chemically attack copper oxide, said agent consisting of water or alcohol and a solution of at least one metal compound of a metal selected from the group consisting of palladium (II), silver (I), copper (I), copper (II) and nickel (II) dissolved in an amide, said agent having a pH in the range of 11 to 13 and concentration of the metal compound in the agent being from 0.01 to 1.0% by weight; and thereafter treating the substrate with a reducing solution to provide a metallic form of said metal on said substrate.

5. The method of claim 4, wherein the amide is at least one member selected from the group consisting of formamide, dimethylformamide, diethylformamide, dimethylacetamide and dimethylacrylamide.

6. The method of claim 5, wherein said metal compound is at least one member selected from the group consisting of a chloride, a fluoride, a bromide, an iodide, a nitrite, a sulfate, an oxide, and a sulfide of the metal.

* * * * *